United States Patent
Komaki

(10) Patent No.: US 7,500,211 B2
(45) Date of Patent: Mar. 3, 2009

(54) UNIT CELL OF SEMICONDUCTOR INTEGRATED CIRCUIT AND WIRING METHOD AND WIRING PROGRAM USING UNIT CELL

(75) Inventor: Masaki Komaki, Kasugai (JP)

(73) Assignee: Fujitsu Microelectronics Limited, Shinjuku-ku, Tokyo (JP)

( * ) Notice: Subject to any disclaimer, the term of this patent is extended or adjusted under 35 U.S.C. 154(b) by 64 days.

(21) Appl. No.: 11/508,195

(22) Filed: Aug. 23, 2006

(65) Prior Publication Data

US 2007/0228419 A1 Oct. 4, 2007

(30) Foreign Application Priority Data

Mar. 31, 2006 (JP) ............................. 2006-098218

(51) Int. Cl.
*G06F 17/50* (2006.01)

(52) U.S. Cl. ................... 716/8; 716/9; 716/10

(58) Field of Classification Search ................ 716/1–14
See application file for complete search history.

(56) References Cited

U.S. PATENT DOCUMENTS

| | | | |
|---|---|---|---|
| 5,291,445 A * | 3/1994 | Miyaoka et al. | 365/189.08 |
| 5,410,173 A * | 4/1995 | Kikushima et al. | 257/368 |
| 5,796,129 A * | 8/1998 | Mizuno | 257/206 |
| 5,872,027 A * | 2/1999 | Mizuno | 438/129 |
| 6,160,275 A * | 12/2000 | Nishio et al. | 257/206 |
| 6,301,692 B1 * | 10/2001 | Kumashiro et al. | 716/10 |
| 6,501,106 B1 * | 12/2002 | Osajima | 257/202 |
| 6,624,492 B2 * | 9/2003 | Kaneko et al. | 257/448 |
| 2004/0133868 A1 * | 7/2004 | Ichimiya | 716/10 |

FOREIGN PATENT DOCUMENTS

| | | |
|---|---|---|
| JP | 61-207031 A | 9/1986 |
| JP | 2004-71878 A | 3/2004 |

* cited by examiner

*Primary Examiner*—Sun J Lin
(74) *Attorney, Agent, or Firm*—Fujitsu Patent Center

(57) ABSTRACT

A unit cell of a semiconductor integrated circuit capable of improving wiring efficiency in layout of a functional circuit block or the like using a unit cell, and a wiring method and wiring program using the unit cell are provided. In a unit cell, auxiliary power wiring regions are formed with reference to grids that exist from a cell edge every basic cell width in the X-direction. Input signal terminals and an output signal terminal are each arranged so as to include at least one wiring connecting portion outside the auxiliary power wiring regions. This makes it possible to wire wiring other than signal wiring in the auxiliary power wiring region. When a functional circuit block is constructed by arranging unit cells in a matrix, auxiliary power wiring regions are formed at a pitch of the basic cell width, through the functional circuit block in the Y-direction.

12 Claims, 5 Drawing Sheets

LAYOUT DIAGRAM OF UNIT CELL 1

DIAGRAM THAT DISPLAYS
FIRST METAL WIRING LAYER M1 OF UNIT CELL 2

LAYOUT DIAGRAM OF FUNCTIONAL CIRCUIT BLOCK 20

LAYOUT DIAGRAM OF FUNCTIONAL CIRCUIT BLOCK 120 IN PRIOR ART

UNIT CELL OF SEMICONDUCTOR INTEGRATED CIRCUIT AND WIRING METHOD AND WIRING PROGRAM USING UNIT CELL

CROSS-REFERENCE TO RELATED APPLICATIONS

This application is based upon and claims the benefit of priority from each of the prior Japanese Patent Application No. 2006-098218 filed on Mar. 31, 2006, the entire contents of which are incorporated herein by reference.

BACKGROUND OF THE INVENTION

1. Field of the Invention

The present invention relates to a unit cell that forms a fundamental unit in a layout of a semiconductor integrated circuit device and further to a wiring method and wiring program using the unit cell, and more particularly, it relates to a unit cell that is used for a gate array type or standard cell type semiconductor integrated circuit device and a wiring method and wiring program using the unit cell.

2. Description of Related Art

Conventionally, semiconductor integrated circuit devices by a gate array type, a standard cell type, and the like for which functional circuit blocks formed by arranging unit cells are arranged in a matrix have existed. In the standard cell type, a functional circuit block 120 is constructed by arranging various types of unit cells (rectangular-shaped regions in FIG. 5) in a matrix, as shown in FIG. 5.

In a first metal wiring layer being a lowermost layer of the respective unit cells, a belt-like power wiring is formed through the unit cells in the X-direction. Therefore, when the unit cells are arranged to construct the functional circuit block 120, power terminals contact with each other between adjoining unit cells, and an X-direction belt-like power wiring 103 called a power rail is wired on the first metal wiring layer. Moreover, in the functional circuit block 120 of FIG. 5, a second metal wiring layer is wired in the Y-direction, a third metal wiring layer is wired in the X-direction, and a fourth metal wiring layer is wired in the Y-direction.

Here, wiring of an auxiliary power wiring to prevent current from concentrating in the power wiring 103 will be described. The auxiliary power wiring is wired on an upper layer of the power wiring 103 in a manner running through the functional circuit block 120 in the Y-direction, and is connected to the power wiring 103.

For example, when signal terminals of the first metal wiring layer are not formed on cell frames of the unit cells, a method for wiring an auxiliary power wiring on the second metal wiring layer being on cell frames in the Y-direction can be considered. This is for preventing a situation that an auxiliary power wiring of the second metal wiring layer hides signal terminals of the first metal wiring layer. However, the X-direction widths of the respective unit cells constituting the functional circuit block 120 take values having no correlation with each other. Accordingly, the unit cells cannot be laid in a manner that X-coordinates of the cell frames are aligned. Therefore, the cell frames cannot be arranged through the functional circuit block 120 in the Y-direction. Consequently, an auxiliary power wiring that runs through the functional circuit block 120 in the Y-direction cannot be formed on the second metal wiring layer by use of the cell frames.

Moreover, as shown in an auxiliary power wiring 104 of FIG. 5, a method for forming an auxiliary power wiring that runs through the functional circuit block 120 in the Y-direction on parts other than cell frames in the Y-direction can be considered. In this case, however, it has been necessary to wire the auxiliary power wiring 104 not on the second metal wiring layer but on the fourth metal wiring layer being a further upper layer by bypassing. This is because, if the auxiliary power wiring 104 is formed on the second metal wiring layer, the signal terminals of the first metal wiring layer are hidden, and a situation that signal wiring cannot be drawn out of the signal terminals can consequently occur.

As the above-described related arts, Japanese unexamined patent publication No. 2004-71878 and Japanese unexamined patent publication No. 1986(S61)-207031 have been disclosed.

SUMMARY OF THE INVENTION

At intersecting portions between the power wiring 103 wired on the first metal wiring layer and the auxiliary power wiring 104 wired to the fourth metal wiring layer, stacked vias in which vias to connect the second metal wiring layer, third metal wiring layer, and respective metal wiring layers are stacked up exist. And, in the respective unit cells having said stacked vias, the stacked vias are formed at random X-coordinate positions in the unit cells. Then, since signal wiring formed on the second metal wiring layer and various signal wirings formed on the third metal wiring layer are obstructed by the stacked vias, wiring efficiency declines, which is a problem. In addition, when the auxiliary power wiring 104 is wired on the second metal wiring layer, logic cells cannot be wired since signal wiring is obstructed by the auxiliary power wiring 104, and the degree of integration consequently declines, which is a problem.

In addition, in order to reduce the obstruction to signal wiring by the stacked vias, reduction in the number of the auxiliary power wirings 104 is considered. However, when the auxiliary power wirings 104 are reduced in number, owing to expansion in the pitch between the auxiliary power wirings 104, a current concentration in the power wiring 103 cannot be eased. Then, electromigration and characteristic degradations such as a voltage drop occur, which is a problem.

In addition, in order to expand the pitch between the auxiliary power wirings 104, it is necessary to increase the wiring width of the power wiring 103 so as to increase allowable amperage of the power wiring 103. Then, increase in height of the unit cells in the Y-direction with the increase in the wiring width causes a decline in the degree of integration, which is a problem.

The present invention has been made in order to solve at least one of the problems of the background arts as described above, and it is an object of the present invention to provide a unit cell of a semiconductor integrated circuit that is capable of improving wiring efficiency in layout of a functional circuit block or a semiconductor integrated circuit device using a unit cell, and a wiring method and wiring program using the unit cell.

To achieve the above object, there is provided a unit cell that forms a rectangular-shaped fundamental unit in a layout of a semiconductor integrated circuit device and in which a first power wiring is wired in a first direction by a layout arrangement, comprising: an input/output terminal that includes at least one wiring connecting portion connectable to signal wiring wired on an upper level wiring layer; and at least one upper-layer wiring region that is formed, through the unit cell in a second direction orthogonal to the first direction, at a predetermined position in the first direction, wherein the input/output terminal is arranged so that at least one wiring connecting portion exists outside the upper-layer wiring region.

A unit cell is a rectangular-shaped fundamental unit in a layout of a semiconductor integrated circuit device. A plurality of types of unit cells exist for various types of logic circuits. In each unit cell, belt-like power terminals that run through the unit cell in a first direction are formed. Therefore, by a layout arrangement of the unit cells, the power terminals are made to connect with each other, and a first power wiring is formed in the first direction.

The input/output terminal includes at least one wiring connecting portion. The wiring connecting portion is a part that makes the input/output terminal connectable to signal wiring wired on an upper level wiring layer of the input/output terminal. The upper-layer wiring region is formed through the unit cell in a second direction orthogonal to the first direction. At least one upper-layer wiring region is formed at a predetermined position in the first direction of the unit cell. The input/output terminal is arranged so that at least one wiring connecting portion exists outside the upper-layer wiring region.

There is also provided an automatic arranging/wiring method using a unit cell that forms a rectangular-shaped fundamental unit in a layout of a semiconductor integrated circuit device and in which a first power wiring is wired in a first direction by a layout arrangement comprising the steps of: forming at least one upper-layer wiring region provided, through the unit cell in a second direction orthogonal to the first direction, at a predetermined position in the first direction; and arranging an input/output terminal so that at least one of wiring connecting portions that are included in the input/output terminal and connectable to signal wiring wired on an upper level wiring layer exists outside the upper-layer wiring region.

There is also provided an automatic arranging/wiring program using a unit cell that forms a rectangular-shaped fundamental unit in a layout of a semiconductor integrated circuit device and in which a first power wiring is wired in a first direction by a layout arrangement comprising the steps of: forming at least one upper-layer wiring region provided, through the unit cell in a second direction orthogonal to the first direction, at a predetermined position in the first direction; and arranging an input/output terminal so that at least one of wiring connecting portions that are included in the input/output terminal and connectable to signal wiring wired on an upper level wiring layer exists outside the upper-layer wiring region.

In the step of forming an upper-layer wiring region, formed is at least one upper-layer wiring region that is provided, through the unit cell in a second direction orthogonal to the first direction, at a predetermined position in the first direction. In the step of arranging an input/output terminal, an input/output terminal is arranged so that at least one of the wiring connecting portions that are connectable to signal wiring wired on an upper level wiring layer, included in the input/output terminal, exists outside the upper-layer wiring region.

Operations will now be described. Each of the input/output terminal includes at least one wiring connecting portion. Then, it becomes possible to always draw out signal wiring out of the wiring connecting portion outside the upper-layer wiring region. Since this makes it unnecessary to wire signal wiring in the upper-layer wiring region, it becomes possible to wire wiring other than signal wiring in the upper-layer wiring region outside the upper-layer wiring region. Namely, the upper-layer wiring region is a region where signal wiring is unnecessary.

Moreover, the upper-layer wiring region is formed, in a unit cell, at a predetermined position in the first direction. Therefore, when a plurality of unit cells are arranged in a matrix to construct a functional circuit block, between the unit cells that contact with each other in the second direction, the upper-layer wiring regions are positioned on an identical horizontal grid in the second direction, and the upper-layer wiring regions contact with each other. Then, in a manner running through the functional circuit block in the second direction, belt-like upper-layer wiring regions are formed. Therefore, regions where signal wiring is unnecessary are generated at fixed intervals. Then, since the signal wiring is separated from other wiring, it becomes possible to wire other wiring without obstructing the signal wiring. This can prevent occurrence of a situation that wiring efficiency declines owing to obstruction to the signal wiring.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Semiconductor integrated circuit devices have been designed by an automatic arranging/wiring system employing a calculator or the like. An automatic arranging/wiring method includes a standard cell type as a representative. In the standard cell type, basic gates and frequently-used logic circuit patterns are first registered in a cell library as unit cells. Then, arrangement of the unit cells and multilayer wiring between the cells are carried out based on a netlist of the semiconductor integrated circuit device so that an automatic arrangement design is completed.

An embodiment of the present invention will be described in detail by use of FIG. 1 to FIG. 4. Unit cells according to the present embodiment are characterized in that the cell widths of all unit cells registered in the cell library have been unified at integral multiples of a basic cell width BCW. Here, for example, unit cells that can be formed with cell widths narrower than the basic cell width BCW (for example, a simple logic circuit such as an inverter) are formed with expanded cell widths to match the basic cell width BCW. Moreover, the value of the basic cell width BCW is provided, based on a grid width that is a pitch determined based on a wiring width and a wiring interval of wiring in the Y-direction, as an integral multiple of the grid width.

Figure 1:
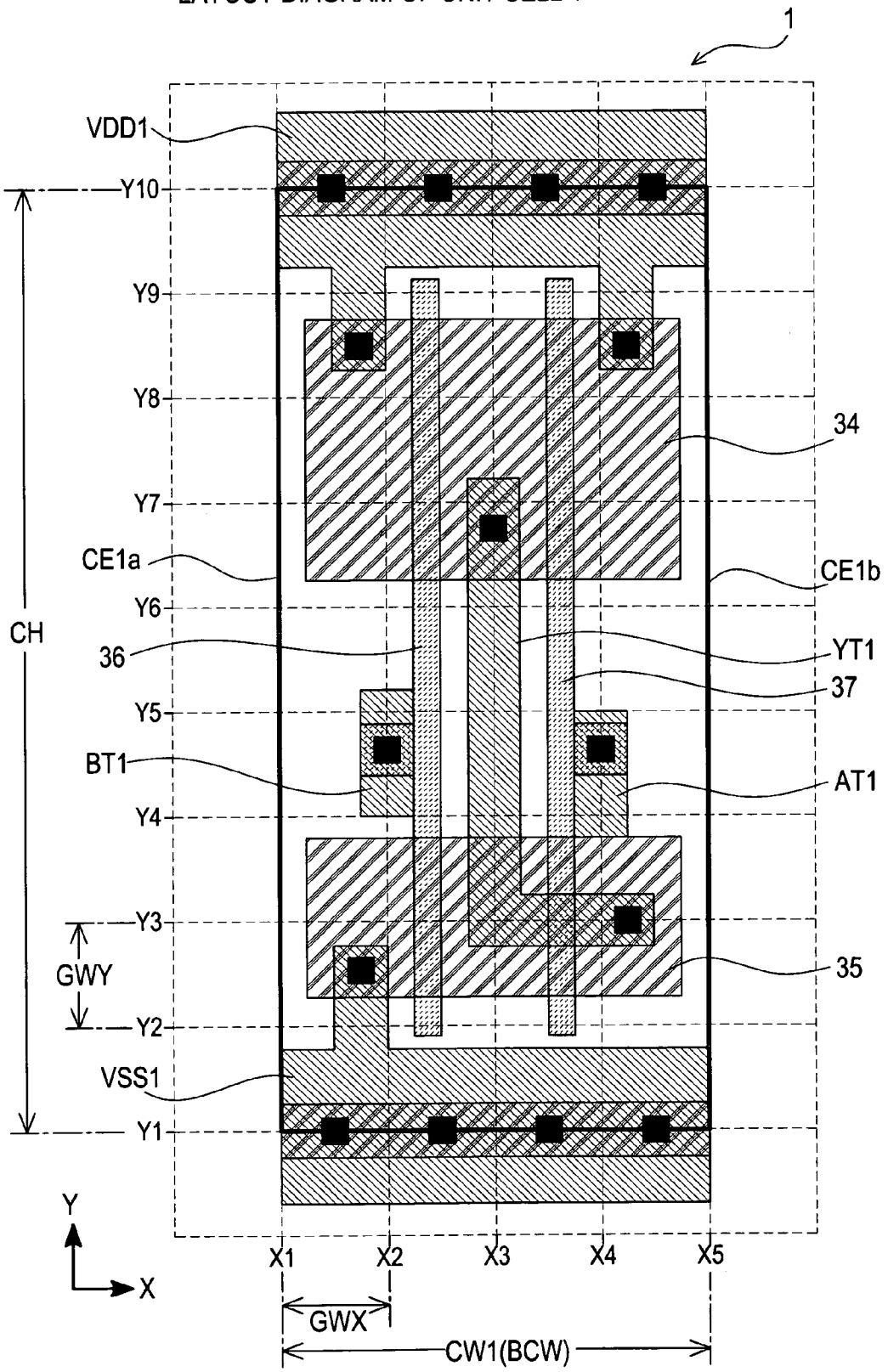
FIG. 1 is a layout diagram of a unit cell 1.

FIG. 1 is a layout diagram of a unit cell 1 of a 2-input NAND circuit based on the present invention. For the unit cell 1, by dividing a set of P-type and N-type diffusion regions 34 and 35 by two polysilicon gates 36 and 37, two PMOS and NMOS transistors using a region sandwiched by two polysilicon gates 36 and 37 as a common source or drain region are formed.

Input signal terminals AT1 and BT1, an output signal terminal YT1, and power terminals VDD1 and VSS1 are formed by a first metal wiring layer Ml. The power terminals VDD1 and VSS1 are connection terminals to supply a power potential and a ground potential to N-type and P-type well regions. And, as will be described later, the power terminals VDD1 and VSS1 contact with each other between adjoining unit cells when the unit cells 1 are arranged in a matrix, whereby a belt-like power wiring is formed. And, although not illustrated, wiring in the Y-direction is conducted on a second metal wiring layer M2 and a fourth metal wiring layer M4, and wiring in the X-direction is conducted on a third metal wiring layer M3. The various types of terminals including the input signal terminal AT1 formed by the first metal wiring layer M1 are connected to these upper wiring layers via vias.

In the unit cell 1, horizontal grids X1 to X5 being grids that extend parallel to the Y-axis are arranged with a grid width GWX. The grid width GWX is a pitch determined based on a wiring width and a wiring interval of wiring in the Y-direction. In addition, a cell width CW1 of the unit cell 1 is provided as the basic cell width BCW. Here, the basic cell width BCW has a value that is an integral multiple (4 times) of the grid width GWX.

By the horizontal grids X1 to X5, positions of cell edges that form a cell frame of the unit cell 1 are determined. A cell edge CE1a is provided at the position of the horizontal grid X1, while a cell edge CE1b is provided at the position of the horizontal grid X5. By the horizontal grids X1 to X5, positions of the input signal terminals AT1 and BT1 and output signal terminal YT1 in the X-axis direction are determined.

Moreover, vertical grids Y1 to Y10 being grids that extend parallel to the X-axis are arranged with a grid width GWY. The grid width GWY is a pitch determined based on a wiring width and a wiring interval of wiring in the X-axis direction. By the vertical grids Y1 to Y10, a cell height CH being a size in the Y-axis direction of the unit cell 1 and positions of the various types of terminals in the Y-axis direction are determined. Here, the cell height CH is provided as a value that is an integer multiple (9 times) of the grid width GWY. And, the cell heights of all other unit cells arranged in the X-axis direction are also unified at the identical cell height CH.

Moreover, unit cells according to the present embodiment are characterized by each including an auxiliary power wiring region, with reference to a cell edge, every basic cell width BCW in the X-direction. Each input/output signal terminal is arranged at such a position that at least one of the wiring connecting portions of each input/output signal terminal exists outside the auxiliary power wiring region. Namely, the arranging position of the input/output signal terminal is limited by the auxiliary power wiring region. Moreover, as will be described later, the auxiliary power wiring region is a region where signal wiring is unnecessary. Therefore, it is possible to wire an auxiliary power wiring in the auxiliary power wiring region.

Figure 2:
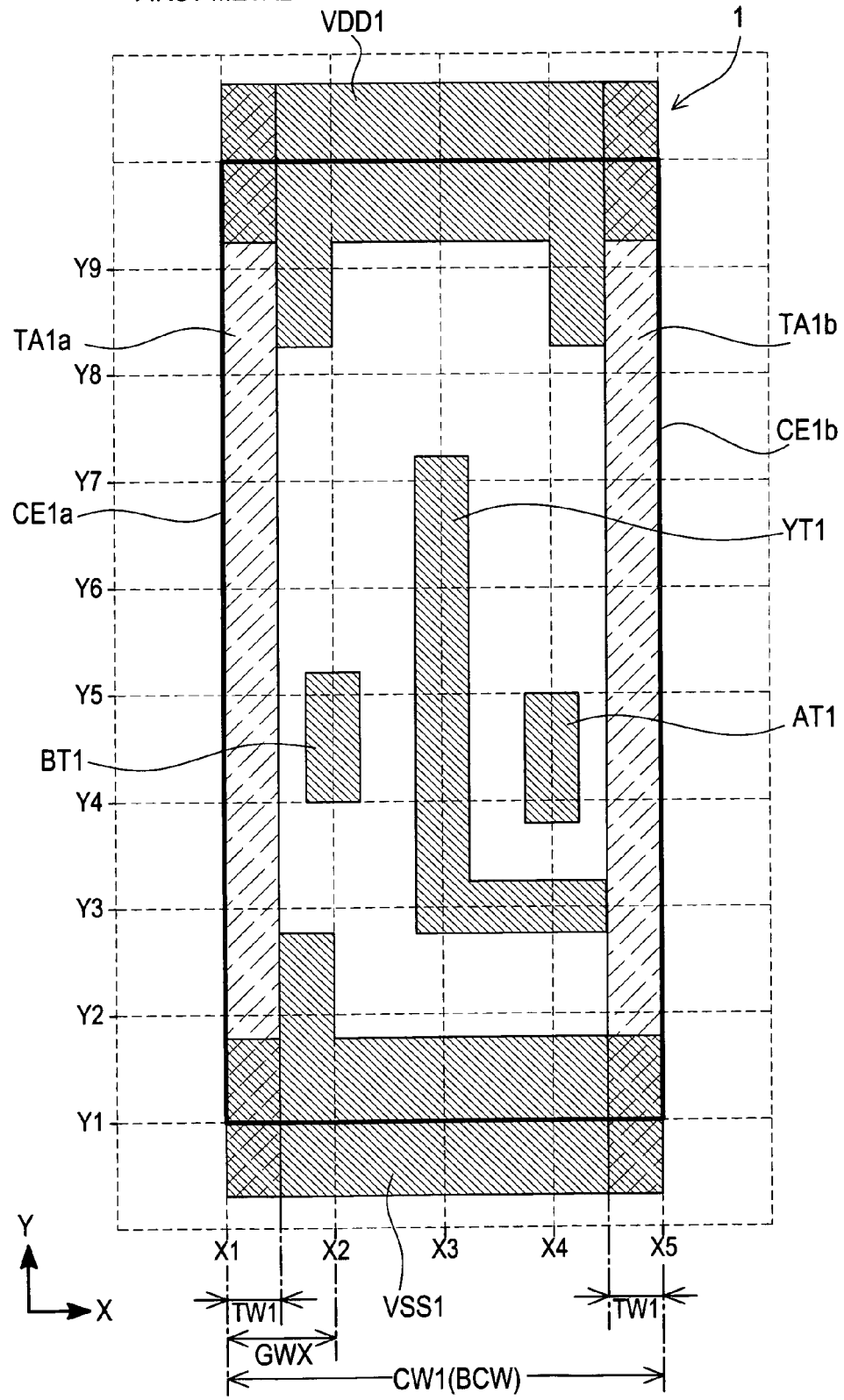
FIG. 2 is a diagram that displays a first metal wiring layer M1 of a unit cell 1.

FIG. 2 shows a diagram that displays the first metal wiring layer M1 of the unit cell 1. The unit cell 1 includes auxiliary power wiring regions TA1a and TA1b. The auxiliary power wiring region TA1a is formed through the unit cell 1 in the Y-direction so as to contact with the cell edge CE1a in the Y-direction of the unit cell 1. In addition, the auxiliary power wiring region TA1b is formed so as to contact with a cell edge CE2a being a position shifted from the cell edge CE1a in the X-direction at a pitch of the basic cell width BCW. The auxiliary power wiring regions TA1a and TA1b are both formed in belt-like forms in the Y-direction with a width TW1 equal to a ½ value of a width where wire passage is possible determined based on a wiring width and a wiring interval.

The wiring connecting portions are sites where vias with an upper-layer wiring are formed. The input signal terminal AT1 includes one wiring connecting portion at an intersection between the horizontal grid X4 and vertical grid Y4. In addition, the input signal terminal BT1 includes one wiring connecting portion at an intersection between the horizontal grid X2 and vertical grid Y5. In addition, the output signal terminal YT1 includes a total of six wiring connecting portions at intersections between the horizontal grid X3 and vertical grids Y3 to Y7 and an intersection between the horizontal grid X4 and vertical grid Y3. Here, the input signal terminals AT1 and BT1 and output signal terminal YT1 each include at least one wiring connecting portion outside the auxiliary power wiring regions TA1a and TA1b.

Figure 3:
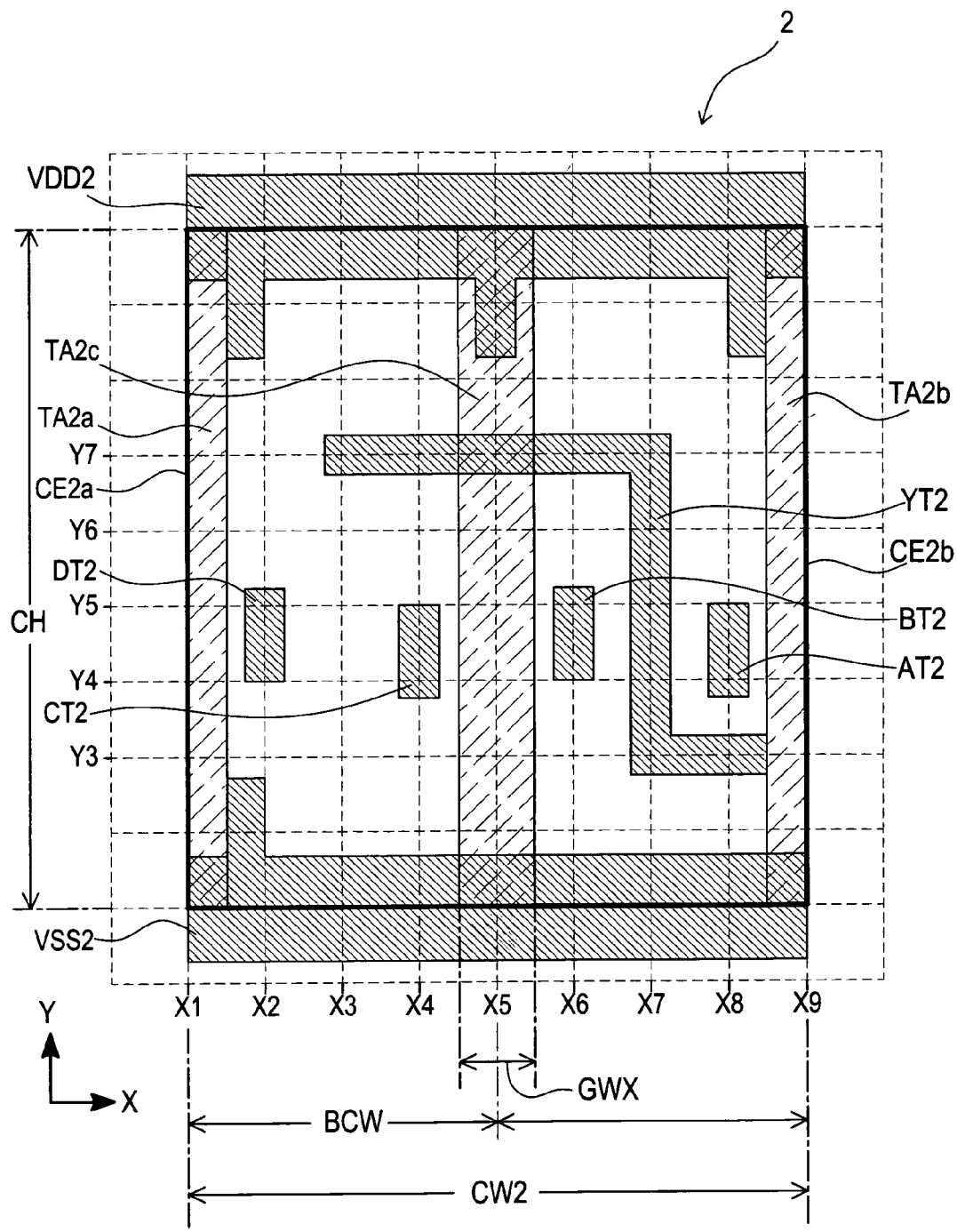
FIG. 3 is a diagram that displays a first metal wiring layer M1 of a unit cell 2.

FIG. 3 is a layout diagram that displays the first metal wiring layer M1 of a unit cell 2 of a 4-input NAND circuit based on the present invention. A cell width CW2 of the unit cell 2 takes a value of an integral multiple (2 times) of the basic cell width BCW. In the unit cell 2, horizontal grids X1 to X9 are arranged with the grid width GWX. The cell height of the unit cell 2 is provided as a cell height CH equivalent to that of the unit cell 1.

The unit cell 2 includes auxiliary power wiring region TA2a to TA2c. The auxiliary power wiring region TA2a is formed so as to contact with a cell edge CE2a of the unit cell 2. In addition, the auxiliary power wiring region TA2c is formed with the horizontal grid X5 being a position shifted from the cell edge CE2a in the X-direction at a pitch of the basic cell width BCW as a center line. In addition, the auxiliary power wiring region TA2b is formed so as to contact with a cell edge CE2b being a position shifted from the horizontal grid X5 in the X-direction at a pitch of the basic cell width BCW. In this manner, the auxiliary power wiring regions are formed, with reference to cell edges, based on the grids that exist every basic cell width BCW in the X-direction.

An input signal terminal AT2 includes one wiring connecting portion at an intersection between the horizontal grid X8 and vertical grid Y4. An input signal terminal BT2 includes one wiring connecting portion at an intersection between the horizontal grid X6 and vertical grid Y5. An input signal terminal CT2 includes one wiring connecting portion at an intersection between the horizontal grid X4 and vertical grid Y4. An input signal terminal DT2 includes one wiring connecting portion at an intersection between the horizontal grid X2 and vertical grid Y5. Since these input signal terminals AT2 to DT2 each include only one wiring connecting portion, the wiring connecting portions are arranged outside the auxiliary power wiring regions TA2a to TA2c. This makes it possible for the input signal terminals AT2 to DT2 to each include at least one wiring connecting portion outside the auxiliary power wiring regions TA2a to TA2c.

In addition, an output signal terminal YT2 includes ten wiring connecting portions at an intersection between the horizontal grid X8 and vertical grid Y3, intersections between the horizontal grid X7 and vertical grids Y3 to Y7, and intersections between the vertical grid Y7 and horizontal grids X3 to X6. Here, the wiring connecting portion at the intersection between the horizontal grid X5 and vertical grid Y7 exists within the auxiliary power wiring region TA2c. However, nine other wiring connecting portions of the output signal terminal YT2 exist outside the auxiliary power wiring region TA2c. Therefore, by using any one of these nine wiring connecting portions, signal wiring can be drawn out of the output signal terminal YT2 without forming signal wiring in the auxiliary power wiring region TA2c. Since this makes it unnecessary to wire signal wiring in the auxiliary power wiring region TA2c, it becomes possible to wire wiring other than signal wiring in the auxiliary power wiring region TA2c.

Figure 4:
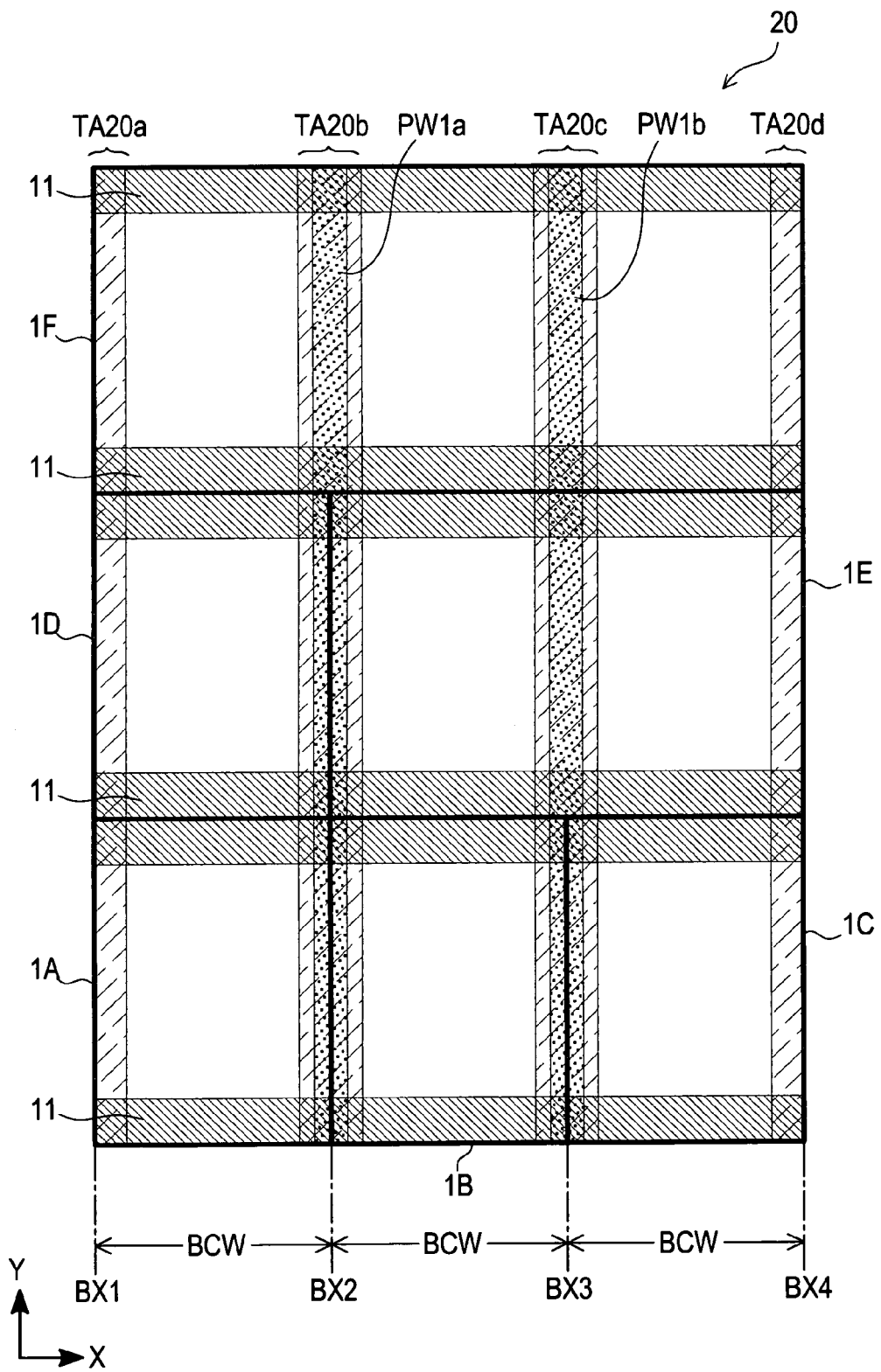
FIG. 4 is a layout diagram of a functional circuit block 20.
Figure 5:
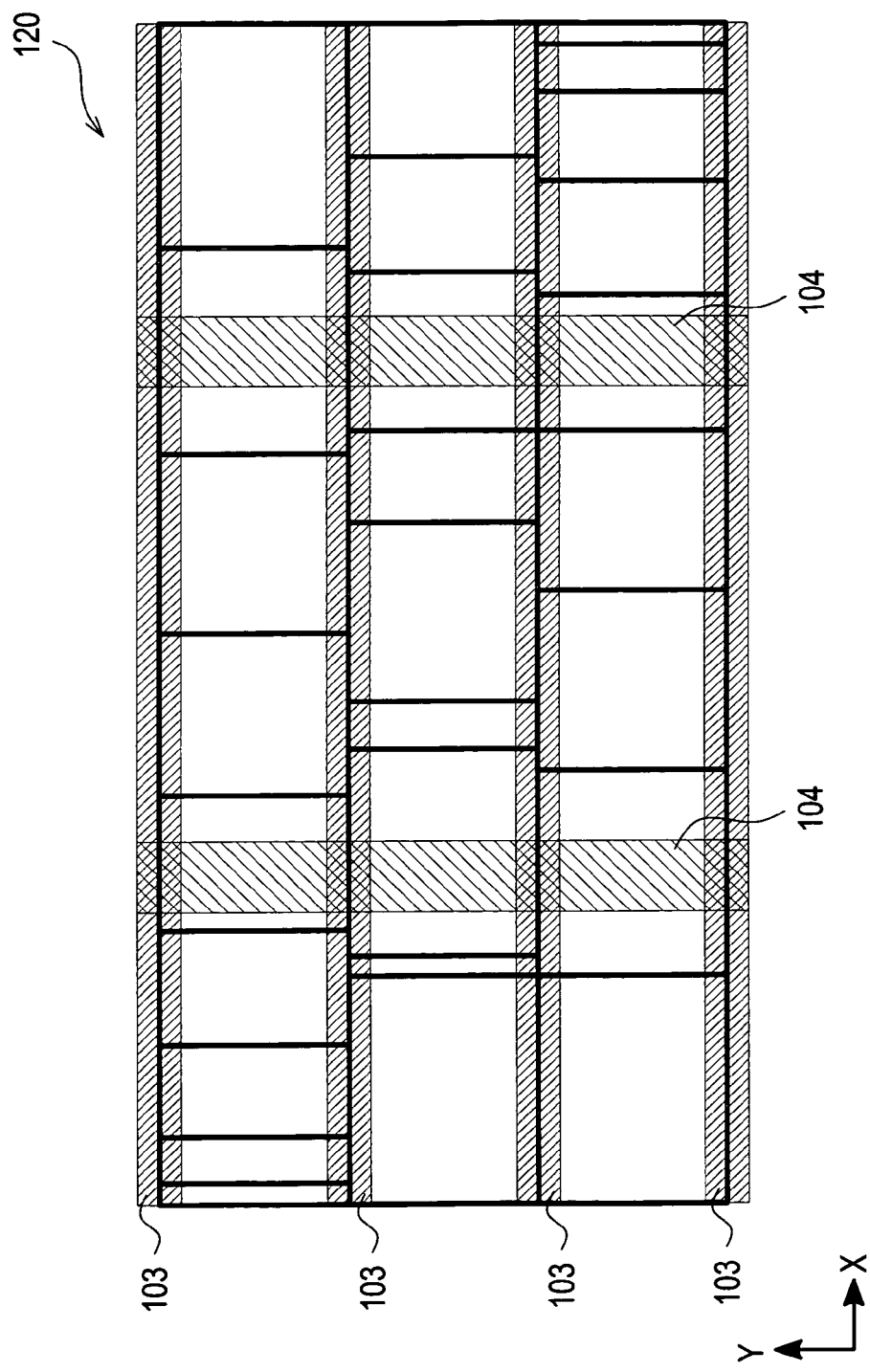
FIG. 5 is a layout diagram of a functional circuit block 120 in the prior art.

Effects of unit cells according to the present invention will be described by use of FIG. 4. FIG. 4 shows a layout diagram of a functional circuit block 20 constructed by arranging six unit cells 1A to 1F in a matrix. The unit cells 1A to 1F include, as described above, belt-like power terminals that run through the unit cells in the X-direction on the first metal wiring layer M1. Therefore, when the unit cells are arranged to construct the functional circuit block 20, the power terminals contact with each other between adjoining unit cells, and X-direction belt-like power wirings 11 are wired on the first metal wiring layer.

The cell width of the unit cells 1A to 1D take a basic cell width BCW, the cell width of the unit cell 1E is twice the basic cell width BCW, and the cell width of the unit cell 1F is three times the basic cell width BCW. The cell heights of the unit cells 1A to 1F are all identical. As described above, each of the unit cells 1A to 1F includes, with reference to a cell edge in the Y-direction, auxiliary power wiring regions at a pitch of the basic cell width BCW. Therefore, when the unit cells are arranged in a matrix to construct the functional circuit block 20, the auxiliary power wiring regions are positioned on identical horizontal grids BX1 to BX4, and the auxiliary power wiring regions contact with each other. Thereby, on the horizontal grids BX1 to BX4, belt-like auxiliary power wiring regions TA20a to TA20d are formed through the functional circuit block 20 in the Y-direction. Namely, regions that run through the functional circuit block 20 in the Y-direction and where signal wiring is unnecessary are formed on the second metal wiring layer M2 at a pitch of the basic cell width BCW.

At intersections between the auxiliary power wiring regions TA20b and TA20c and power wirings 11, vias are formed so that the power wirings 11 that supply a ground potential are connected to each other. In addition, vias are formed so that the power wirings 11 that supply a power potential are connected to each other. On the second metal wiring layer M2, auxiliary power wirings PW1a and PW1b are wired within the auxiliary power wiring regions TA20b and TA20c, and outside the regions, various signal wirings are wired.

Thereby, in the auxiliary power wiring regions of the second metal wiring layer M2, auxiliary power wirings are formed, and signal wiring is formed in a region other than the auxiliary power wiring regions. Namely, as a result of the auxiliary power wiring being wired on the horizontal grids BX1 and BX4 and the various signal wirings being wired on other horizontal grids, since the auxiliary power wiring is separated from the signal wiring, it becomes possible to wire the auxiliary power wiring without obstructing the signal wiring.

Here, the auxiliary power wirings PW1a and PW1b are wirings to prevent current from concentrating in the power wirings 11. Namely, when unit cells are consecutively arranged, a sum of currents consumed by the arranged unit cells flows to the power wirings 11. If the current is large, this causes electromigration and a voltage drop. Therefore, by forming the auxiliary power wirings PW1a and PW1b in the Y-direction, the current that flows to the power wirings 11 can be limited to a consumption current of a circuit that exists between auxiliary power wirings, and a current concentration can thus be prevented.

As in the above, in the unit cell 2 according to the present embodiment, the regions where signal wiring is unnecessary, that is, the regions where auxiliary power wiring is possible, can be formed at the pitch of the basic cell width BCW. Then, since the auxiliary power wiring is separated from the signal wiring, it becomes possible to wire the auxiliary power wiring without obstructing the signal wiring. Consequently, occurrence of a situation that wiring efficiency declines can be prevented.

Moreover, this makes it possible to wire auxiliary power wiring on the second metal wiring layer M2, which is a wiring layer on which wiring is conducted in the Y-direction and is a nearest upper level wiring layer of the wiring layer on which input/output terminals are formed. Then, in comparison with the case where the auxiliary power wiring is wired on the fourth metal wiring layer being an upper layer by bypassing, since stacked vias of the auxiliary power wirings can be reduced in number, the signal wiring on the third metal wiring layer M3 is no longer obstructed, and wiring efficiency can thus be improved.

Moreover, this makes it possible to wire the auxiliary power wiring every basic cell width BCW being a cell width of the unit cells. Accordingly, occurrence of failure owing to electromigration and characteristic degradations such as a voltage drop can be prevented. In addition, since a current concentration in the power wirings 11 can be prevented, it is unnecessary to increase the wiring width of the first power wiring. Since this makes it unnecessary to increase the cell height CH of the unit cells 1A to 1F in the Y-direction, the respective unit cells can be reduced in size.

In addition, by wiring the auxiliary power wiring every basic cell width BCW being a cell width of the unit cells, it becomes possible to wire the auxiliary power wiring on the cell edges of the unit cells. Then, when there are regions where no signal wiring is wired on the cell edges, by wiring the auxiliary power wiring in said regions, the regions can be effectively utilized. Therefore, it becomes possible to prevent an increase in the circuit area.

It should be noted that the present invention is by no means limited to the foregoing embodiment, and as a matter of course, various improvements and modifications can be made to the invention without departing from the scope and spirit thereof. Although it has been provided that the common horizontal grids X1 to X5 are used for grids of the cell edge and grids of the input/output signal terminal in the unit cell 1 of FIG. 1 and FIG. 2, the invention is not limited to this mode. The cell edge grids and input/output signal terminal grids may have an offset equal to a ½ grid in the X-direction. In the unit cell I of FIG. 1 and FIG. 2, since the grids of the cell edges and input/output signal terminals are identical, if input/output signal terminals are formed on the cell edges CE1a and CE1b, the input/output signal terminals exist outside beyond the cell edges. Therefore, input/output signal terminals cannot be formed at the input/output signal terminal grids on the cell edges CE1a and CE1b. However, when the grids of cell edges and input/output signal terminals have an offset equal to a ½ grid, signal terminals can be formed on all input/output signal terminal grids. And, in this case as well, by forming auxiliary power wiring regions at the pitch of the basic cell width BCW, it becomes possible to wire the auxiliary power wiring on the second metal wiring layer M2 without obstructing the signal wiring.

In the present embodiment, although a description has been given of the structure where the power wirings 11 are wired by use of the first metal wiring layer M1, the wiring in the Y-direction is conducted on the even-ordered metal wiring layers (the second metal wiring layer M2 and the fourth metal wiring layer M4), and the wiring in the X-direction is conducted on the odd-ordered metal wiring layer (the third metal wiring layer M3), the invention is not limited to this mode. As a matter of course, the wiring in the Y-direction may be conducted on the odd-ordered metal wiring layer and the wiring in the X-direction may be conducted on the even-ordered metal wiring layers. As a matter or course, the power wirings 11 may be formed on the second metal wiring layer M2 or other metal wiring layers. For example, it may be possible to wire the power wirings 11 in the X-direction by use of the second metal wiring layer M2 and wire the auxiliary power wiring in the Y-direction by use of the third metal wiring layer M3.

Moreover, although a description has been given of the functional circuit block 20 constructed by arranging six unit cells in a matrix, the invention is not limited to this mode. As a matter of course, the present invention can also be applied to a case where a greater number of unit cells are arranged in a matrix.

The auxiliary power wiring regions TA1a, TA1b, TA2a to TA2c, and TA20a to TA20d are examples of the upper-layer wiring regions, the auxiliary power wirings PW1a and PW1b are examples of the second power wirings, the grid width GWX is an example of a wiring pitch, the X-direction is an example of the first direction, and the Y-direction is an example of the second direction.

According to the present invention, regions where signal wiring is unnecessary and wiring other than signal wiring can be formed can be generated at a predetermined pitch in unit cells. Since the signal wiring is therefore separated from other wiring, it becomes possible to wire other wiring without obstructing the signal wiring. This can prevent occurrence of a situation that wiring efficiency declines owing to obstruction to the signal wiring.

What is claimed is:

1. A unit cell that forms a rectangular-shaped fundamental unit in a layout of a semiconductor integrated circuit device and in which a first power wiring is wired in a first direction by a layout arrangement, the unit cell comprising:
    an input/output terminal that includes at least one wiring connecting portion connectable to a signal wiring wired on an upper level wiring layer; and
    at least one upper-layer wiring region that is formed, through the unit cell in a second direction orthogonal to the first direction, at a predetermined position in the first direction,
    wherein the input/output terminal is arranged so that the at least one wiring connecting portion exists outside the at least one upper-layer wiring region, and
    wherein the at least one wiring connecting portion is an intersection between A) a wiring pitch determined based on a wiring width and a wiring interval of the signal wiring in the first direction and B) a wiring pitch of the signal wiring in the second direction and is a site where a via for connection between wiring layers can be formed.

2. The unit cell according to claim 1, wherein
the at least one upper-layer wiring region is a region where an upper level wiring layer of a wiring layer on which the input/output terminal is formed, and a second power wiring to be connected to the first power wiring is wired within a range of the at least one upper-layer wiring region.

3. The unit cell according to claim 2, wherein
the wiring layer where the at least one upper-layer wiring region is formed is a wiring layer on which wiring is conducted in the second direction and is a nearest upper level wiring layer of the wiring layer on which input/output terminal is formed.

4. The unit cell according to claim 1, wherein
the predetermined position is a position that exists, with reference to a cell edge in the second direction of the unit cell, at every predetermined pitch in the first direction.

5. The unit cell according to claim 4, wherein
the predetermined pitch is equivalent in value to a basic cell width that is previously determined.

6. The unit cell according to claim 5, wherein
a cell width in the first direction of the unit cell takes a value of an integral multiple of the basic cell width.

7. The unit cell according to claim 5, wherein
the basic cell width takes a value of an integral multiple of a wiring pitch determined based on a wiring width and a wiring interval of the signal wiring.

8. The unit cell according to claim 4, wherein
a width of the at least one upper-layer wiring region that is arranged in contact with the cell edge in the second direction is equal to a half of a width of the at least one upper-layer wiring region that does not contact with the cell edge in the second direction.

9. The unit cell according to claim 4, wherein
a width of the at least one upper-layer wiring region that is arranged out of contact with the cell edge in the second direction takes a value equal to or more than a wiring pitch determined based on a wiring width and a wiring interval of the signal wiring.

10. The unit cell according to claim 4, wherein
a width of the at least one upper-layer wiring region that is arranged in contact with the cell edge in the second direction takes a value equal to or more than ½ of a wiring pitch determined based on a wiring width and a wiring interval of the signal wiring.

11. An automatic arranging/wiring method using a unit cell that forms a rectangular-shaped fundamental unit in a layout of a semiconductor integrated circuit device and in which a first power wiring is wired in a first direction by a layout arrangement comprising:
    forming at least one upper-layer wiring region provided, through the unit cell in a second direction orthogonal to the first direction, at a predetermined position in the first direction; and
    arranging an input/output terminal so that at least one of wiring connecting portions that are included in the input/output terminal and connectable to signal wiring wired on an upper level wiring layer exists outside the at least one upper-layer wiring region, wherein
    the at least one wiring connecting portion is an intersection between A) a wiring pitch determined based on a wiring width and a wiring interval of the signal wiring in the first direction and B) a wiring pitch of the signal wiring in the second direction and is a site where a via for connection between wiring avers can be formed.

12. An automatic arranging/wiring program using a unit cell that forms a rectangular-shaped fundamental unit in a layout of a semiconductor integrated circuit device and in which a first power wiring is wired in a first direction by a layout arrangement comprising:
    forming at least one upper-layer wiring region provided, through the unit cell in a second direction orthogonal to the first direction, at a predetermined position in the first direction; and
    arranging an input/output terminal so that at least one of wiring connecting portions that are included in the input/output terminal and connectable to signal wiring wired on an upper level wiring layer exists outside the at least one upper-layer wiring region, wherein the at least one wiring connecting portion is an intersection between A) a wiring pitch determined based on a wiring width and a wiring interval of the signal wiring in the first direction and B) a wiring pitch of the signal wiring in the second direction and is a site where a via for connection between wiring layers can be formed.

* * * * *